United States Patent
Jacob et al.

(10) Patent No.: US 6,858,890 B2
(45) Date of Patent: Feb. 22, 2005

(54) FERROELECTRIC MEMORY INTEGRATED CIRCUIT WITH IMPROVED RELIABILITY

(75) Inventors: Michael Jacob, Yokohama (JP); Uwe Wellhausen, Yokohama (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 81 days.

(21) Appl. No.: 10/161,908

(22) Filed: Jun. 4, 2002

(65) Prior Publication Data

US 2003/0222279 A1 Dec. 4, 2003

(51) Int. Cl.$^7$ ............ H01L 27/108; H01L 29/76; H01L 29/94; H01L 31/119
(52) U.S. Cl. ............ 257/296; 257/303; 257/306
(58) Field of Search ............ 438/239, 253, 438/254, 396, 397, 398; 257/296, 300, 303, 304, 306, 308, 309, 310

(56) References Cited

U.S. PATENT DOCUMENTS

| | | | |
|---|---|---|---|
| 5,330,931 A | * | 7/1994 | Emesh et al. .......... 438/3 |
| 5,384,287 A | * | 1/1995 | Fukase .......... 438/303 |
| 5,396,095 A | | 3/1995 | Wolters et al. |
| 6,121,649 A | * | 9/2000 | Kunishima .......... 257/295 |
| 6,235,573 B1 | * | 5/2001 | Lee et al. .......... 438/241 |
| 6,242,299 B1 | | 6/2001 | Hickert |
| 6,399,974 B1 | * | 6/2002 | Ohtsuki .......... 257/296 |

FOREIGN PATENT DOCUMENTS

EP 0 877 422 A1 11/1998

OTHER PUBLICATIONS

Ozaki et al., A Fully Planalized 8M Bit Ferroeloetric RAM with "Chain" Cell Structure, 2001 Symposium on VLSI Technology Digest of Technical Papers, Jun. 12, 2001, p. 113–114.

* cited by examiner

Primary Examiner—Hoai Pham
(74) Attorney, Agent, or Firm—Horizon IP Pte Ltd

(57) ABSTRACT

An IC with memory cells arranged in a chained architecture is disclosed. The top local interconnect between the top capacitor electrodes and active area is achieved by using a strap. The use of a strap eliminates the need for additional metal layer which reduces manufacturing costs. Furthermore, sidewall spacers are used to isolate the strap from the different layers of the capacitors. The use of spacers advantageously enables the strap to be self-aligned.

15 Claims, 11 Drawing Sheets

FERROELECTRIC MEMORY INTEGRATED CIRCUIT WITH IMPROVED RELIABILITY

FIELD OF THE INVENTION

The present invention relates to memory integrated circuits (ICs). More particularly, the invention relates to memory ICs, for example, ferroelectric memory ICs, with series architecture.

BACKGROUND OF THE INVENTION

Ferroelectric metal oxide ceramic materials such as lead zirconate titanate (PZT) have been investigated for use in ferroelectric semiconductor memory devices. Other ferroelectric materials, for example, strontium bismuth tantalate (SBT) can also be used. FIG. 1 shows a conventional ferroelectric memory cell 105 having a transistor 130 and a ferroelectric capacitor 140. A capacitor electrode 142 is coupled to a plateline 170 and another capacitor electrode 141 is coupled to the transistor which selectively couples or decouples the capacitor from a bitline 160, depending on the state (active or inactive) of a wordline 150 coupled to the transistor gate.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed, resulting in a non-volatile memory cell.

FIG. 2 shows a plurality of ferroelectric memory cells configured in a chain 202. Such a memory architecture is described in, for example, Takashima et al., 1997 Symposium on VLSI Circuits Digest of Technical Papers, p.83f and Takashima et al., IEEE J. Solid-State Circuits, vol. 33, pp 787–792, May 1998, which are herein incorporated by reference for all purposes. The memory cells 205 of the chain, each with a transistor 230 coupled to a capacitor 240 in parallel, are coupled in series. The gates of the cell transistors are, for example, gate conductors which either serve as or are coupled to wordlines. One end 213 of the chain is coupled to a bitline while the other end 214 is coupled to a plateline. A plurality of chains are interconnected or addressed by wordlines to form a memory block or array.

FIG. 3 shows a conventional cross-section of a memory chain 302. As shown, the transistors 330 of the memory cells are formed on a substrate 310. Adjacent cell transistors share a common diffusion region. The capacitors 340 of the memory chain are grouped in pairs. The bottom electrode 341 serves as a common electrode for adjacent capacitors. The top electrode 342 of a capacitor from a capacitor pair is coupled to the top electrode of a capacitor of an adjacent pair, thus forming a daisy chain. The top capacitor electrodes are coupled to the cell transistors via active area top electrode (AATE) plugs 386.

Conventionally, coupling of the top electrodes of adjacent capacitor pairs is achieved with plugs 348 and a conductive line 362. As a result, the use of chained architectures requires an additional metal process, which includes formation of contact plugs and metal lines. The need for additional metal process increases manufacturing costs as well as raw process time. Furthermore, the formation of contacts requires an additional patterning or etching step which creates additional etch damage.

FIG. 4 shows a top view of two adjacent capacitor pairs 309 of a memory chain. An upper capacitor electrode plug 386 is located between the capacitor pairs. The use of such upper capacitor electrode plugs requires a spacing of 3F between the capacitor pairs, where F is the feature size or ground rule of the IC. One F is required on each side of the plug for separation from the bottom electrodes of the adjacent capacitor pairs while one F is required for the plug. The needed spacing undesirably increases the cell size.

From the foregoing discussion, it is desirable to provide a chained architecture without needing an additional metal process as well as reducing cell size.

SUMMARY OF THE INVENTION

The invention relates to ICs having memory block or array with a chained architecture. More particularly, the invention relates to reducing a metal layer in chained architecture. In chained architecture, memory cell transistors share a common diffusion region with adjacent transistors. Cell capacitors grouped in pairs, with bottom electrodes being common within the pair. Top electrodes of adjacent capacitors of adjacent capacitor pairs are coupled together to a common diffusion region of a cell transistor (e.g., active area or (AA)). For memory cells located at the ends of the chain, their top electrodes are coupled to the diffusion regions of their respective cell transistors. Bottom electrodes are coupled to the other diffusion regions of the cell transistors.

In accordance with the invention, a conductive strap is used to couple the top electrodes of the capacitors to AA. Spacers are provided on the sidewalls of the capacitors, isolating the strap from the different layers of the capacitors. The spacers allow the strap to be self-aligned. The spacers also serve as an encapsulation for the ferroelectric material. In one embodiment, the spacer material comprises aluminum oxide.

In another embodiment, the contacts coupling the top electrodes to the AA are lower than the contacts coupling the bottom electrodes to the AA. This advantageously allows for the alignment of bottom electrode to the contact of the top electrodes to be non-critical. The use of strap as a local interconnect between the top electrodes and AA eliminates the need for additional metal layer, which reduces processing costs.

DETAILED DESCRIPTION OF THE INVENTION

Figure 1:
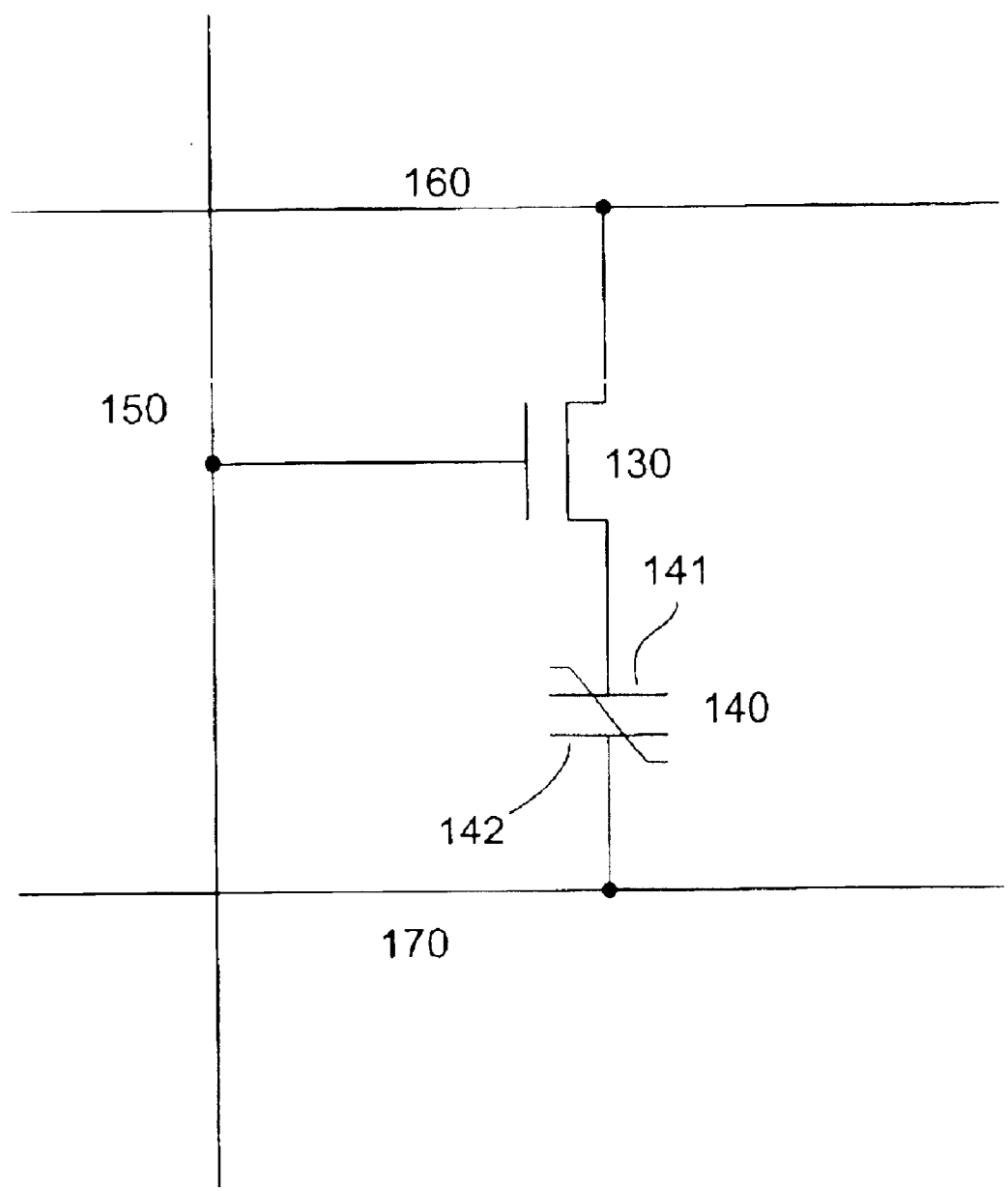
FIG. 1 shows a conventional ferroelectric memory cell.
Figure 2:
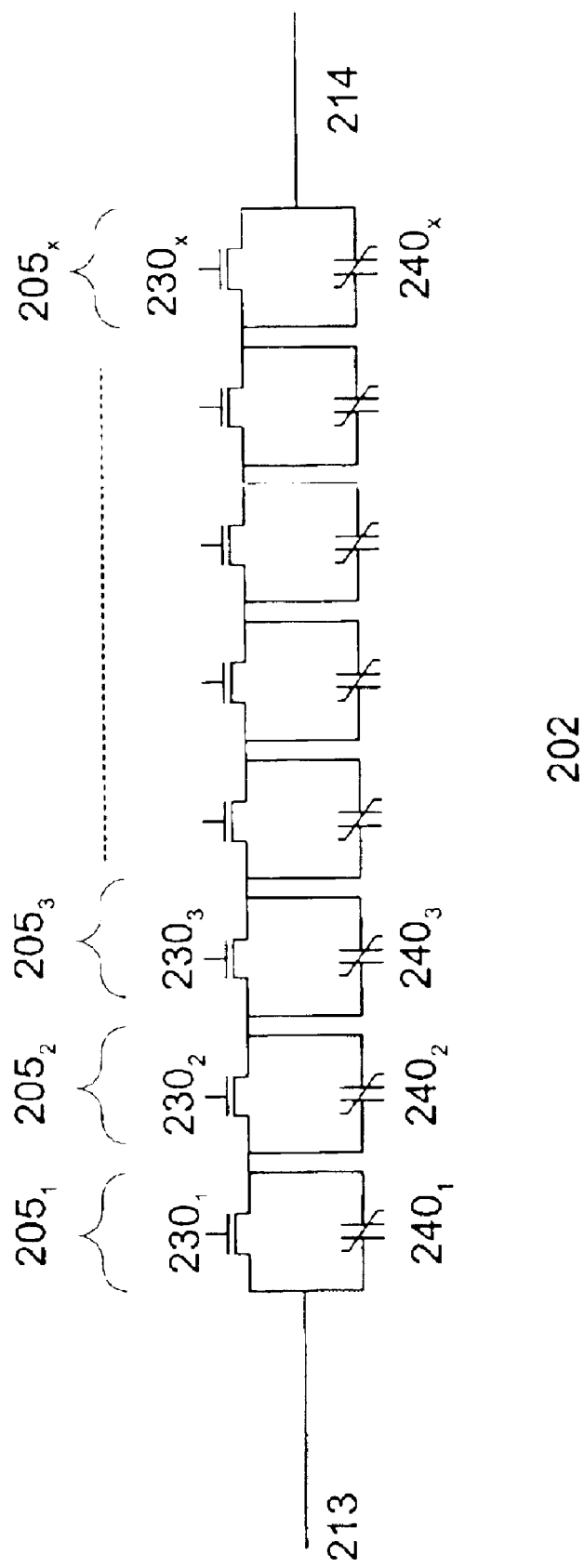
FIG. 2 shows a conventional memory chain.
Figure 3:
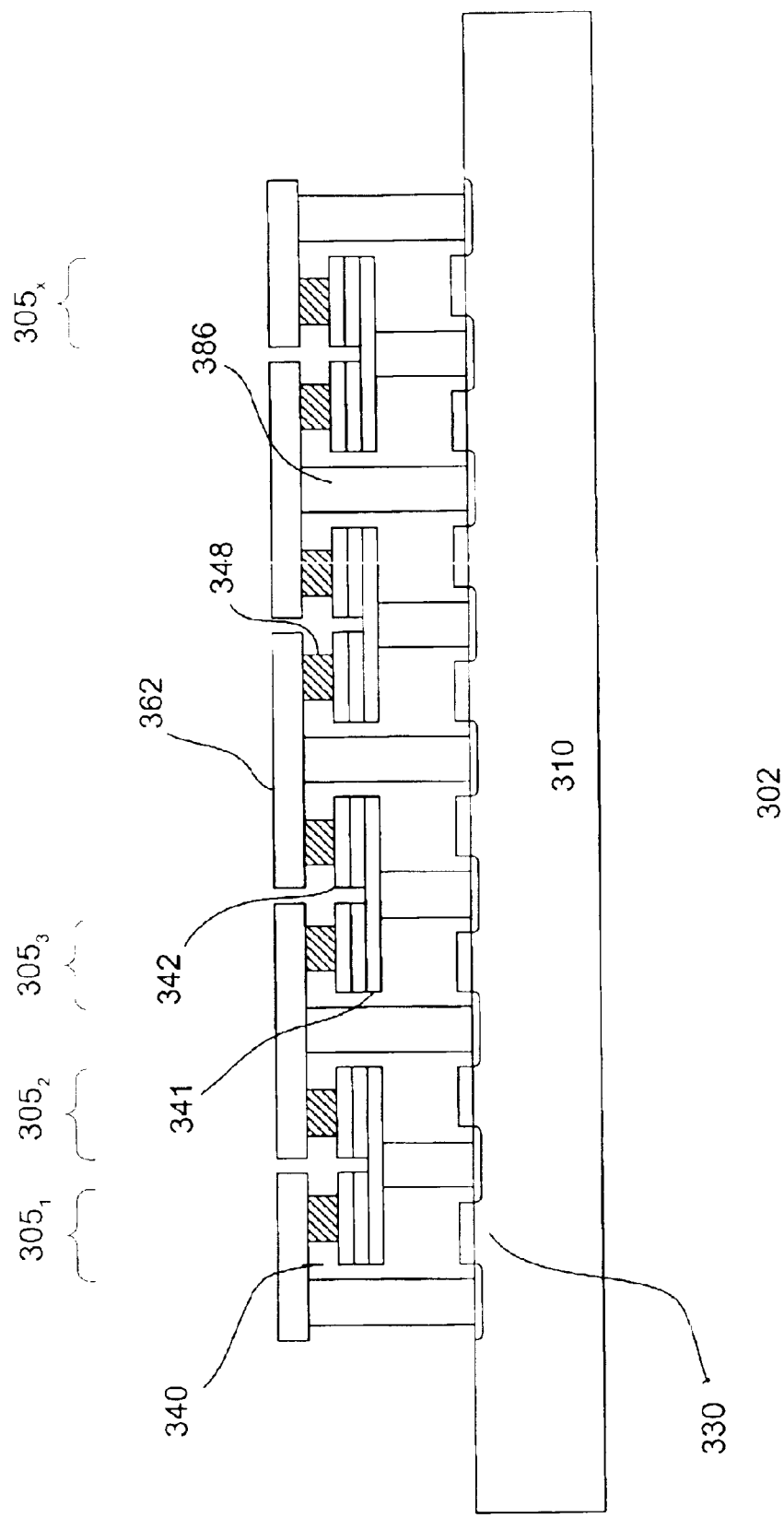
FIG. 3 shows a cross-sectional view of a conventional memory chain.
Figure 4:
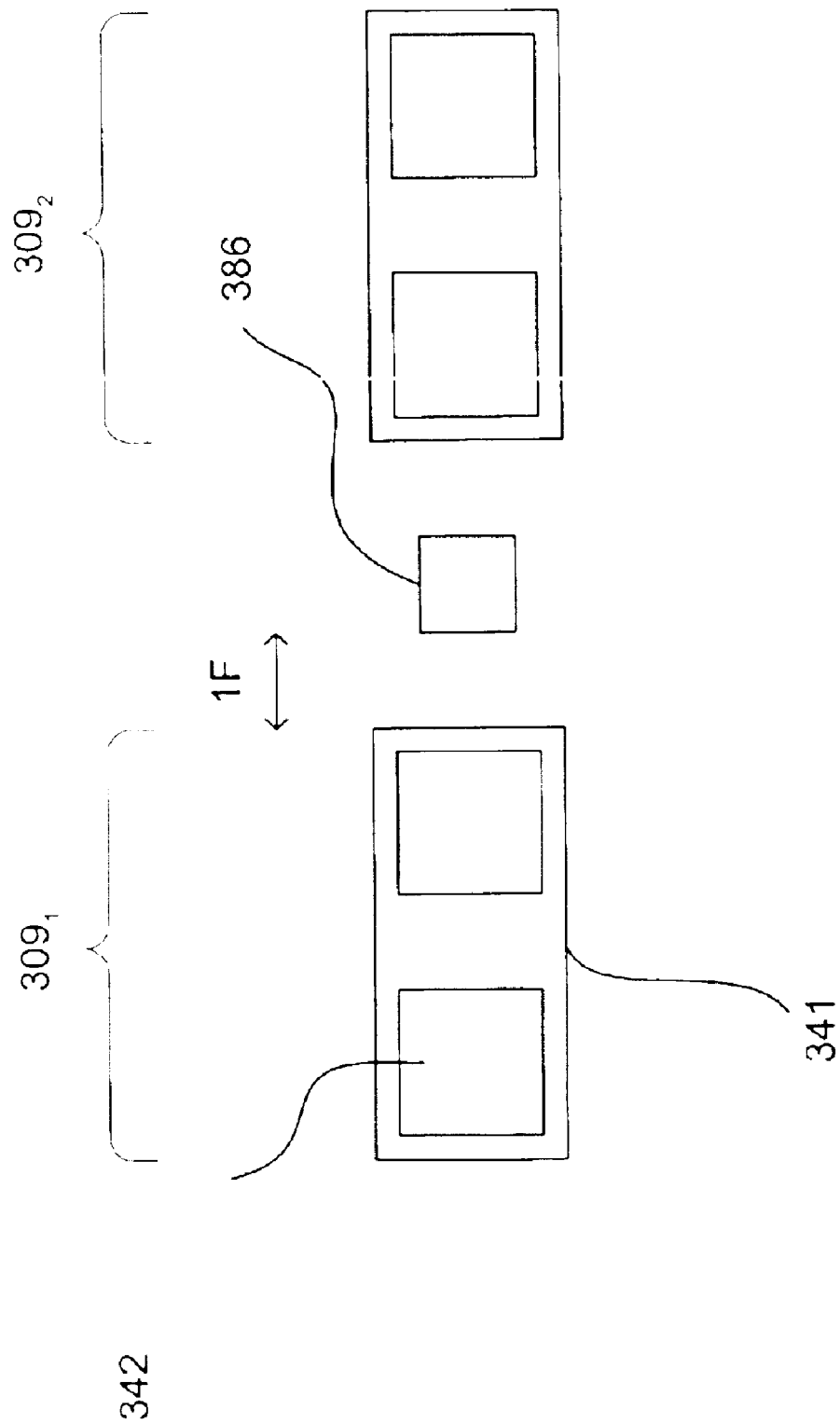
FIG. 4 shows a top view of a portion of a conventional memory chain.
Figure 5:
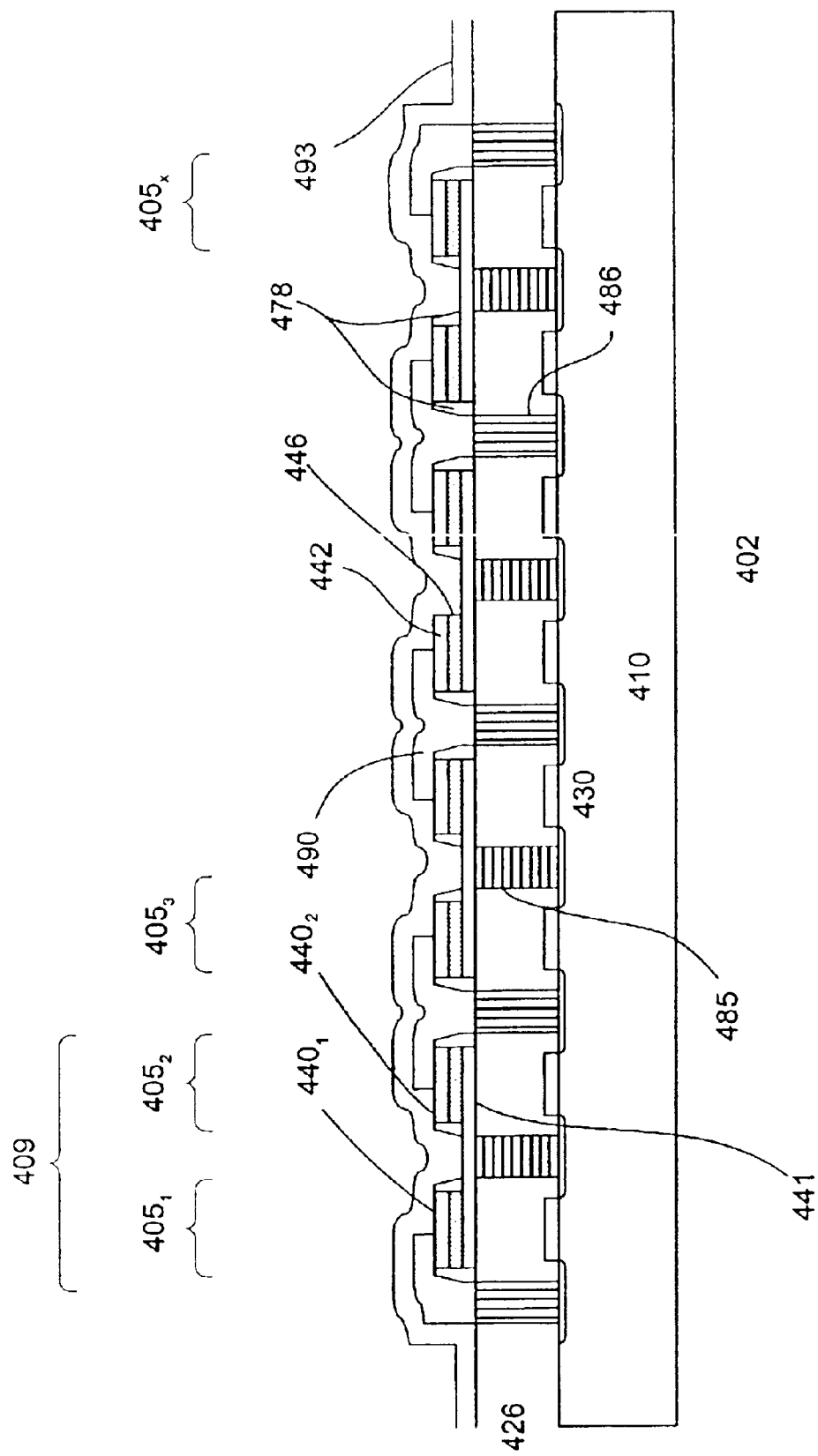
FIG. 5 shows a cross-sectional view of a memory chain in accordance with one embodiment of the invention.

The invention relates generally to chained memory architectures. In one embodiment, the invention relates to ferroelectric memory cells implemented with chained architectures. The invention can also apply to other types of memory cells arranged in a chained architecture. FIG. 5 shows a cross-sectional view of a memory chain 402 in accordance with one embodiment of the invention. The memory chain comprises a plurality of memory cells $405_1$–$405_x$ formed on a substrate 410. The memory cells each comprises a cell transistor 430 coupled to a capacitor in parallel. The cells of the chain are coupled in series. Illustratively, the memory chain comprises 8 memory cells (i.e., x=8). Providing a memory chain with other number of memory cells is also useful. Preferably, the number of cells within a chain is equal to $2^y$, where y is a whole number $\geq 1$.

The transistors, for example, are n-FETs. P-FETs, a combination of p and n-FETs, or other types of transistors can also be used. In one embodiment, a transistor 430 shares a common diffusion region with an adjacent transistor. A selection transistor (not shown) can be provided on one end of the chain, selectively coupling or decoupling the chain to a bitline. The selection transistor can share a common diffusion region with the first cell transistor of the chain.

Above the transistors are provided cell capacitors. The capacitors, in one embodiment, are ferroelectric capacitors. Alternatively, other types of capacitors, such as non-ferroelectric memory capacitors, can be provided. The ferroelectric capacitor comprises a ferroelectric layer, such as lead zirconium titanate (PZT). Other ferroelectric materials, such as strontium bismuth tantalate (SBT), are also useful. Multilayered ferrolectric structures are also useful. The ferroelectric layer is disposed between first and second electrodes formed from, for example, a noble metal (e.g., platinum). Other types of conductive materials, such as strontium ruthenium oxide (SRO) or iridium oxide (IrO), can also be used. Multilayered electrode structures, which may comprise additional materials like Ti, TiN, Ir, or others, are also useful. The first and second electrodes need not be formed from the same material.

An interlevel dielectric (ILD) layer 426 is provided, separating the transistors and capacitors. The ILD comprises, for example, silicon oxide. Other types of dielectric materials, such as silicon nitride, can be used to form the ILD.

A barrier layer can be provided between the plug and bottom electrode to prevent or inhibit the diffusion of, for example, oxygen to the plug. The barrier layer comprises, in one embodiment, iridium. Other types of barrier layers are also useful. The use of barrier layers is particularly useful for ferroelectric, high k dielectric, or other applications where plug oxidation is a concern. An adhesion layer can also be provided between the barrier layer and ILD layer to promote adhesion of the barrier layer. The adhesion layer can comprise, for example, titanium. Other types of materials which promote adhesion between the ILD and barrier layer are also useful.

In one embodiment, two adjacent capacitors 440 share a common electrode, grouping the capacitors into pairs 409. Preferably, the capacitors share a bottom common electrode. Active area bottom electrode (AABE) plugs 485 are provided in the ILD, each coupling a bottom electrode of a capacitor to one of the diffusion regions of a transistor. Preferably, an AABE plug couples a bottom electrode of a capacitor pair to one of the common diffusion regions of a transistor. The plugs, for example, comprise tungsten (W). Other types of conductive materials, such as doped poly-Si, can also be used. For poly-Si plugs, a metal silicide comprising, for example, cobalt or titanium, can be provided between the plug and capacitor.

In accordance with one embodiment of the invention, the top electrodes of two adjacent capacitors of adjacent capacitor pairs are coupled via a conductive strap 490. A strap is coupled to the other diffusion region of a transistor via an AATE plug 486. Preferably, a strap couples the top electrode of two adjacent capacitors from different capacitor pairs to the other common diffusion region of two transistors via an AATE plug.

In one embodiment, the AATE and AABE are formed by separate processes. The AATE plugs are formed with their top surfaces below the top surfaces of the AABE plugs. Providing AATE plugs that are lower than AABE plugs advantageously increases the process window since the alignment between the bottom electrodes 441 and plugs is not critical. Furthermore, the different plugs can be optimized separately. Alternatively, the AATE and AABE plugs can be formed in the same process.

The strap contacts the top capacitor electrodes. Generally, the strap should contact the electrodes sufficiently to provide the desired electrical characteristics. For example, the strap contacts about half of the surface area of the top electrode. The strap comprises, in one embodiment, poly-Si. Other types of conductive materials, such as aluminum, titanium nitride, titanium, tungsten, as well as multi-layered conductive structures, can also be used to form the strap.

In one embodiment, spacers 478 are provided on the sidewalls of the capacitor to electrically isolate the sides of the capacitors from the conductive strap, preventing the electrodes from being shorted. The spacers comprise a dielectric material, such as alumina ($Al_2O_3$). Other types of dielectric materials, including titanium oxide, silicon nitride, silicon oxide, or multi-layered dielectric structure, are also useful. In one embodiment, the spacers also advantageously serve as an encapsulation layer for the ferro electric material, protecting it against contaminates, e.g., hydrogen or water. An encapsulation layer 493 can be provided over the capacitors and straps, protecting the memory chain from, for example, hydrogen which degrades the properties of the ferroelectric material.

One end of the memory chain is coupled to a bitline while the other end is coupled to a plateline. The gates of the cell transistors, for example, serve as or are coupled to wordlines. The bitline and plateline can be formed on the first metal level, while the wordlines are formed on a second metal level. Other types of wiring schemes are also useful.

Figure 6:
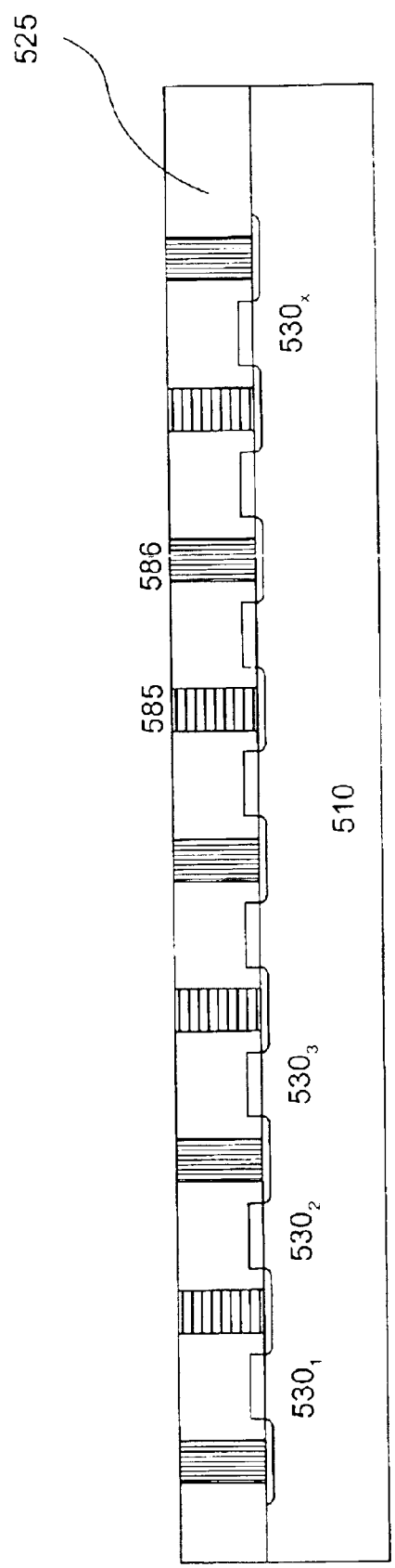
FIGS. 6–10 show a process for forming a memory chain in accordance with one embodiment of the invention.

FIGS. 6–10 show a process for forming a memory chain in accordance with one embodiment of the invention. Referring to FIG. 6, a semiconductor substrate 510 is provided. The substrate is prepared with cell transistors of the memory chain. Other components for IC (not shown) can also be prepared on the substrate. The cell transistors, in one embodiment, share a common diffusion region with adjacent cell transistors. The cell transistors, for example, are n-FETs. P-FETS, a combination of n and p-FETs, or other types of transistors can also be used.

An ILD layer 525 is provided over the substrate. The ILD, for example, comprises silicon oxide. Other types of dielectric materials, such as silicon nitride, doped or undoped silicate glass, or spin-on glass, are also useful. Multilayered ILD structures are also useful. Various techniques can be used to form the ILD, such as chemical vapor deposition (CVD).

Plugs 585 and 586 are formed in the dielectric, coupling to diffusion regions of the cell transistors. In one embodiment, plugs 585 (AABE) couple the bottom capacitor electrodes to the transistors while plugs 586 (AATE)

couple the top capacitor electrodes to the transistors. The plugs, for example, comprise a conductive material such as poly-Si. Other types of conductive material, such as tungsten (W), can also be used.

The plugs are formed using conventional techniques. For example, a resist layer is deposited on the ILD layer and patterned to form openings corresponding to vias in which plugs are formed. An anisotropic etch, such as reactive ion etching (RIE), is then performed. The RIE removes portions of the ILD layer exposed by the resist mask. creating vias. A conductive material is then deposited on the substrate, filling the vias. Excess conductive material over the ILD is then removed by, for example, chemical mechanical polishing (CMP). The CMP creates a planar surface between the plugs and ILD.

A liner layer, such as titanium, can be deposited on the substrate to line the via walls prior to filling the vias. The liner layer can be used for silicidation of the substrate material to reduce contact resistance. A barrier, such as titanium nitride, can also be provided to line the via walls. The barrier layer inhibits reaction between the substrate and plug materials. Depending on whether the liner and/or barrier layers are conductive or not, the bottom of the via may be removed to expose the diffusion region.

In one embodiment, AATE and AABE plugs are made separately. The height of the AATE plugs 586 are lower than the height of the AABE plugs 585. For example, a first dielectric layer is deposited following by formation of AATE plugs. Thereafter, a second dielectric layer is deposited and the AABE plugs are formed. Forming the plugs separately is particularly useful for applications in which the plugs for the top and bottom electrodes require different electrical characteristics, such as resistance. Furthermore, having AATE plugs which are lower than AABE plugs increases the process window since the alignment between the plugs and bottom capacitor electrodes is non-critical.

In another embodiment, AATE plugs 586 used for coupling the transistors to the top electrodes are formed using two process steps. AATE plugs 586, for example, have the same or similar electrical requirements as those for peripheral devices (e.g., resistance). As such, the lower portion of AATE plugs is formed during the formation of plugs for peripheral devices. Alternatively, plugs 586 can be formed in a single process step.

Figure 7:
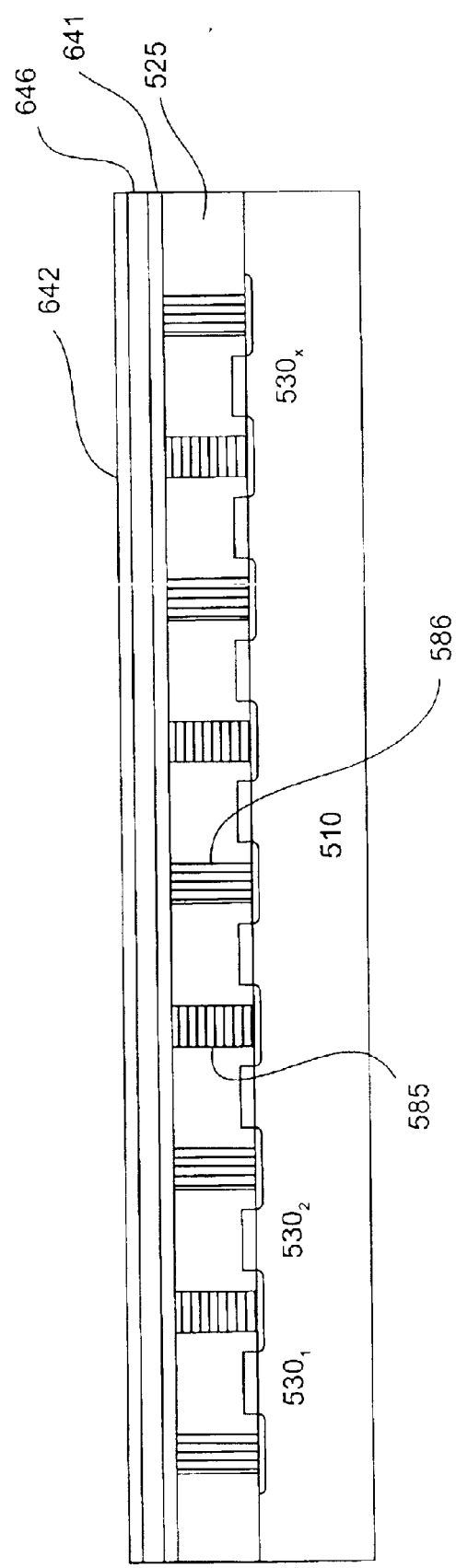

Referring to FIG. 7, the various capacitor layers are deposited on the substrate. In one embodiment, the capacitor layers comprise layers for forming ferroelectric capacitors. To form a ferroelectric capacitor, first electrode 641, ferroelectric layer 646 and second electrode 642 are sequentially deposited on the substrate. In one embodiment, the electrode material comprises a noble metal such as platinum, the ferroelectric material comprises lead zirconium titanate (PZT). Other conductive and ferroelectric materials can also be used. For example, strontium bismuth tantalate (SBT), can also be used to form the ferroelectric layer while other conductive oxides such as SRO or IrO can be used to form the electrodes. The first and second electrodes could also be formed from different conductive materials. In alternative embodiments, the various capacitor layers are used to form non-ferroelectric capacitors such as dynamic random access memory (DRAM) capacitors. For example, conventional DRAM electrodes and dielectric layers are used. Various techniques, such as CVD, MOCVD, PVD, and spin-on, can be used to form the various capacitor layers.

In one embodiment, a barrier layer is formed prior to forming the first electrode. The barrier layer comprises, for example, iridium. Other materials which can inhibit the diffusion oxygen, such as titanium nitride, can also be used. To promote adhesion between the barrier layer and ILD, an adhesion layer can be provided beneath the barrier layer. The adhesion layer comprises, in one embodiment, titanium. Alternatively, other adhesion promoting materials can be used. Various techniques, for example PVD and CVD, can be used to form the barrier and adhesion layers.

For applications where the plug comprises poly-Si, a metal silicide layer is formed over the ILD prior to the capacitor layers. The metal silicide, for example comprises titanium or cobalt. Other metal suicides are also useful. The metal silicide is formed by, for example, conventional techniques.

Figure 8:
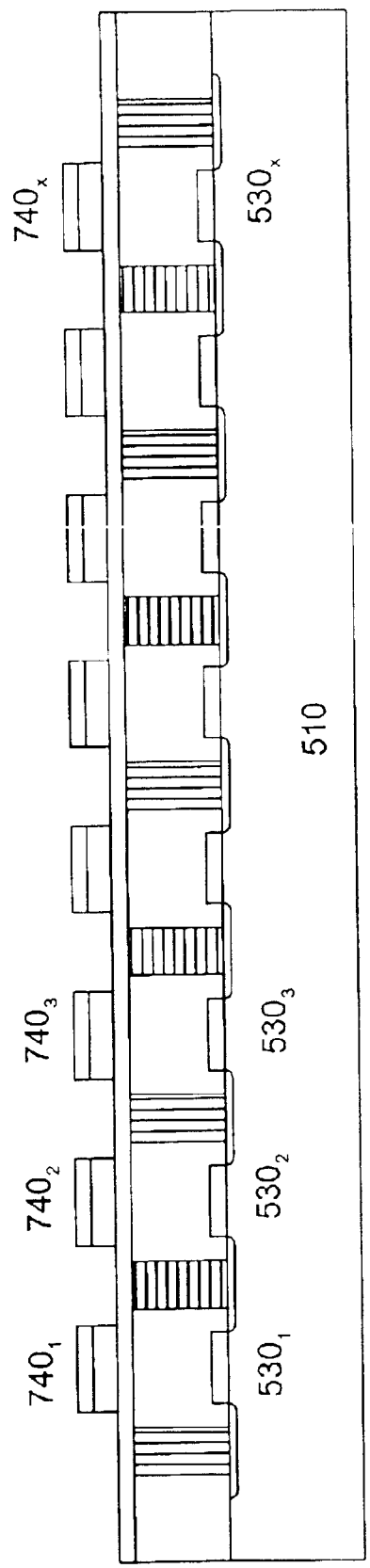

Referring to FIG. 8, the dielectric and top electrode layers are selectively patterned to form upper portions of the capacitors. Conventional mask and etch techniques can be used to pattern the layers. For example, a hard mask is deposited on the top capacitor layer. The hard mask, in one embodiment, comprises $SiO_2$. Other hard mask material is also useful. A photoresist layer is deposited on the hard mask layer. An antireflective (ARC) layer can be formed beneath the photoresist. The photoresist layer is patterned, leaving a resist block to protect the hard mask layer in regions corresponding to the area of the capacitor. An anisotropic etch, such as an RIE, is used to remove the exposed portions of the hard mask layer to expose the top capacitor layer. The resist is removed after the hard mask is patterned. An RIE is then performed to remove the top electrode and dielectric layer unprotected by the hard mask, thus forming the upper portion of the capacitors.

Figure 9:
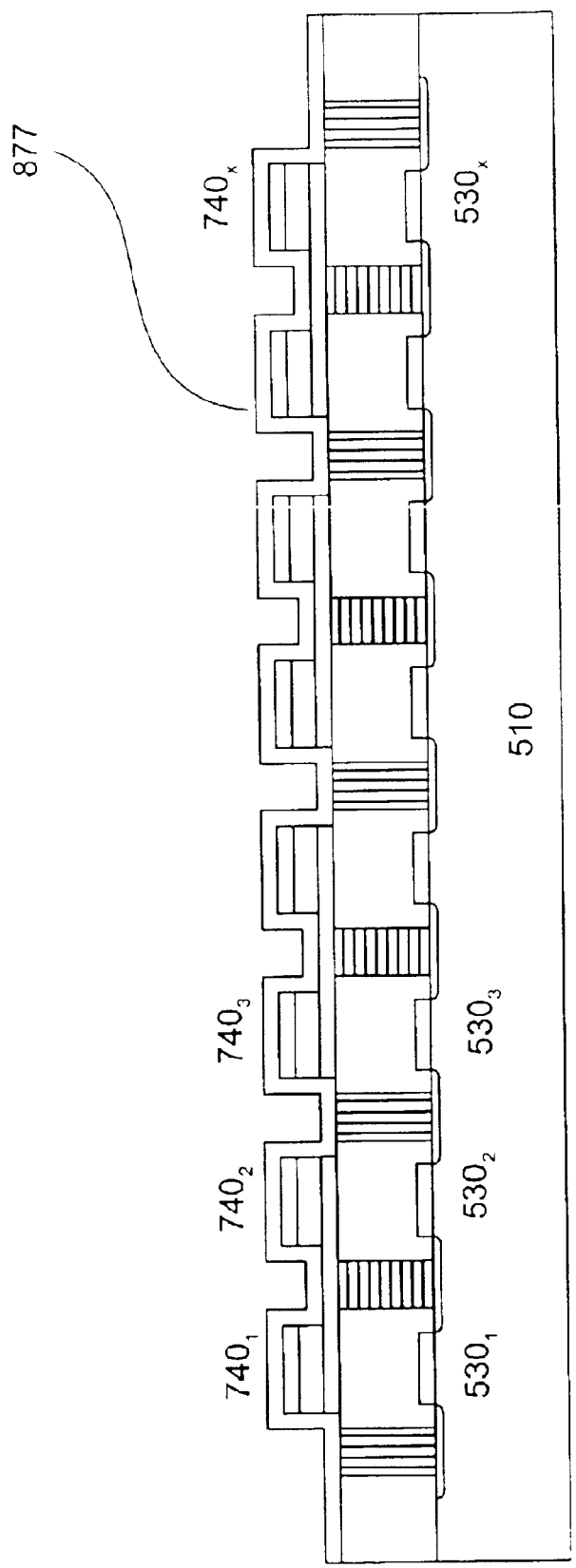

Referring to FIG. 9, the bottom electrode as well as capacitor layers below (e.g., silicide, adhesion, and/or barrier) are patterned, forming the lower portion of the capacitors. Patterning of the bottom electrode layer is performed using, for example, a hard mask. In one embodiment, the bottom electrode serves as a common electrode for two adjacent capacitors. The process of forming the lower portions of the capacitors exposes the top surfaces of the AATE plugs. The dielectric layer is overetched to ensure that the top surfaces of the AATE plugs are exposed.

A spacer layer 877 is conformally deposited over the substrate, covering the capacitors and plugs 586. In one embodiment, the spacer layer comprises a dielectric material such as alumina. The spacer layer also serves as an encapsulation layer, protecting the ferroelectric material from, for example, hydrogen. Other dielectric materials, such as titanium oxide, silicon nitride, or other types of nitrides, are also useful. Alternatively, the spacer layer may also be formed from multi-layered dielectric stack comprising $SiO_2$ and/or nitrides. The spacer layer is deposited by, for example, sputtering or PVD. Other deposition techniques, such as CVD or ALD, can also be used to form the spacer layer.

Figure 10:
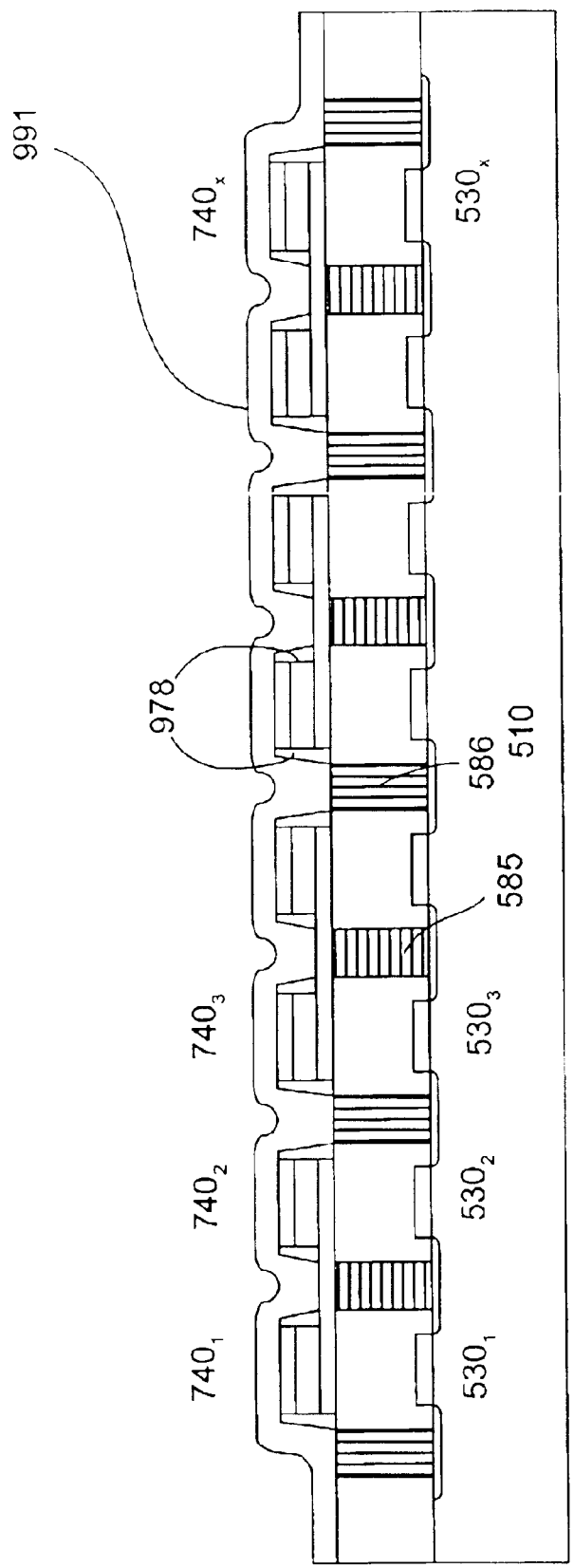

Referring to FIG. 10, an anisotropic etch is performed. The etch, for example, comprises an RIE. The RIE removes the horizontal portions of the spacer layer, exposing the surface of the capacitors and plugs 586 while leaving capacitors sidewalls protected by spacers 978.

In one embodiment, an etch stop layer is deposited over the substrate. The etch stop layer, for example, comprises a conductive layer such as titanium nitride. Providing an etch stop layer advantageously reduces subsequent etch damage to the top electrodes. The use of non-conductive layer such as silicon oxide is also useful. If a non-conductive layer is used, a patterning step is performed to expose a portion of the top electrode and contacts 586.

A conductive layer 991 is then formed over the substrate, covering the capacitors and sufficiently filling the region between two adjacent capacitor pairs. The conductive material, in one embodiment, comprises doped poly-Si. Other types of conductive materials, such as titanium nitride, titanium, aluminum, tungsten, copper or platinum, alloys thereof, or a combination thereof, can also be used. Various techniques can be used to form the conductive materials, such as PVD or CVD.

Subsequently, the conductive layer is patterned, forming straps which couple top electrodes of adjacent capacitors from adjacent capacitor pairs to plugs 586. In one embodiment, the straps are formed using conventional masking and etching techniques. The straps sufficiently contact the top electrodes to produce the desired electrical characteristics. In one embodiment, the straps contact about half of surface of the top electrodes.

The sidewall spacers isolate the various layers of the capacitors, preventing shorting of the electrodes. An encapsulation layer can be deposited over the capacitors. The encapsulation layer reduces or prevents for example, hydrogen from degrading the ferroelectric material. In one embodiment, the encapsulation layer comprises silicon nitride or aluminum oxide. Other types of encapsulation materials which protect the ferroelectric material from hydrogen can also be used. The encapsulation layer can be formed using conventional techniques, such as PVD or CVD. The use of spacer layer and strap advantageously provides a self-aligned process for coupling the top electrodes to the transistors without requiring a metal process.

Figure 11:
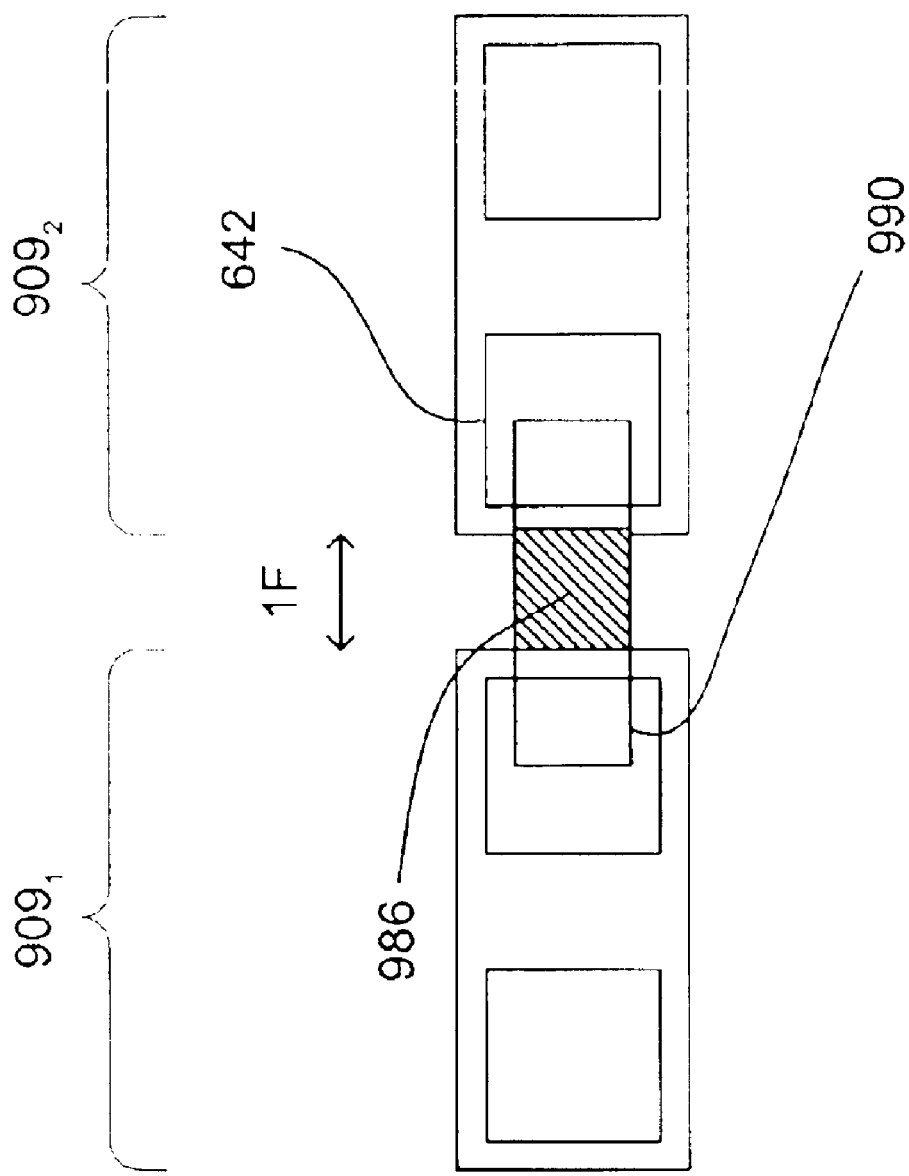
FIG. 11 shows a top view of a portion of a memory chain in accordance with one embodiment of the invention.

FIG. 11 shows a layout of the memory cells in accordance with one embodiment of the invention. As shown, two adjacent capacitor pairs 909 are provided. An AATE plug 986 is located between the capacitor pair. A strap 990 couples the top electrodes 642 of two adjacent capacitors from different capacitor pairs to the AATE plug. By using sidewall spacers to isolate the electrodes of the capacitor from the strap, the present invention facilitates 1F spacing between the capacitor pairs. This advantageously results in smaller cell size and reduced manufacturing cost.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit (IC) comprising:
    a first memory cell including a first transistor with first and second diffusion regions and a first capacitor with a capacitor dielectric layer between top and bottom electrodes, the first capacitor coupled to the first diffusion region of the first transistor;
    a second memory cell including a second transistor with first and second diffusion regions and a second capacitor with a dielectric layer between top and bottom electrodes, the second capacitor coupled to the first diffusion region of the second transistor;
    the second diffusion regions of the first and second transistors form a common diffusion region;
    a first contact coupled to the common diffusion region of the transistors, wherein a height of the first contact is substantially planar or below a lower surface bottom electrodes of the capacitors;
    sidewall dielectric spacers lining sidewalls of the capacitors, when the sidewall dielectric spacers are formed, an upper surface of the first contact plug is exposed;
    an interlevel dielectric layer covering the substrate and capacitors, including the sidewall dielectric spacers; and
    a non-planar strap contacting the top electrodes of the first and second capacitors and the first contact, the non-planar strap is isolated from the capacitor dielectric layer and bottom electrode of the capacitors by the sidewall dielectric spacers wherein, then non-planar strap and spacers avoids the use of contact vias associated with the top electrodes and the first contact.

2. The IC of claim 1 wherein the capacitor dielectric layer is a ferroelectric layer.

3. The IC of claim 1 wherein the bottom electrode of the first capacitor is a common electrode with a third capacitor of a third memory cell and the bottom electrode of the second capacitor is a common electrode of a fourth capacitor of a fourth memory cell forming memory cells in a chain architecture.

4. The IC of claim 2 wherein the bottom electrode of the first capacitor is a common electrode with a third capacitor of a third memory cell and the bottom electrode of the second capacitor is a common electrode of a fourth capacitor of a fourth memory cell forming memory cells in a chain architecture.

5. The IC of claim 1 wherein the bottom electrodes of the first and second capacitors are coupled to respective first diffusion regions of the first and second transistors via a second contact, forming memory cells in a chain architecture.

6. The IC of claim 5 wherein a top surface of the first contact is below a top surface of the second contact.

7. The IC of claim 1, 2, 3, 4, 5 or 6 wherein the spacers comprise a dielectric material.

8. The IC of claim 7 wherein the dielectric material inhibits diffusion of hydrogen.

9. The IC of claim 8 wherein the strap comprises a material selected from the group comprising polysilicon, aluminum, titanium, titanium nitride, tungsten, platinum and copper, alloys thereof, or a combination thereof.

10. The IC of claim 8 wherein the strap comprises a stack of multiple conductive materials.

11. The IC of claim 7 wherein the spacers comprise aluminum oxide.

12. The IC of claim 11 wherein the strap comprises a material selected from the group comprising polysilicon, aluminum, titanium, titanium nitride, tungsten, platinum and copper, alloys thereof, or a combination thereof.

13. The IC of claim 11 wherein the strap comprises a stack of multiple conductive materials.

14. The IC of claim 7 wherein the strap comprises a material selected from the group comprising polysilicon, aluminum, titanium, titanium nitride, tungsten, platinum and copper, alloys thereof, or a combination thereof.

15. The IC of claim 14 wherein the strap comprises a stack of multiple conductive materials.

* * * * *